United States Patent [19]

Hong et al.

[11] Patent Number: 5,460,999
[45] Date of Patent: Oct. 24, 1995

[54] METHOD FOR MAKING FIN-SHAPED STACK CAPACITORS ON DRAM CHIPS

[75] Inventors: Gary Hong; Chen-Chiu Hsue, both of Hsin-chu, Taiwan

[73] Assignee: United Microelectronics Corporation, Hsinchu, Taiwan

[21] Appl. No.: 254,535

[22] Filed: Jun. 6, 1994

[51] Int. Cl.$^6$ .............................. H01L 21/70; H01L 27/00
[52] U.S. Cl. .................. 437/60; 437/52; 437/919
[58] Field of Search .................. 437/47, 52, 60, 437/919; 257/304–308, 311

[56] References Cited

U.S. PATENT DOCUMENTS

| | | | |
|---|---|---|---|
| 5,021,357 | 6/1991 | Taguchi et al. | 437/52 |
| 5,053,351 | 10/1991 | Fazan et al. | 437/52 |
| 5,071,783 | 12/1991 | Taguchi et al. | 437/52 |
| 5,084,405 | 1/1992 | Fazan et al. | 437/52 |
| 5,142,639 | 8/1992 | Kohyama et al. | 357/23.6 |
| 5,164,337 | 11/1992 | Ogawa et al. | 437/47 |
| 5,170,233 | 12/1992 | Liu et al. | 437/52 |
| 5,187,548 | 2/1993 | Baek et al. | 257/308 |
| 5,192,702 | 3/1993 | Tseng | 437/47 |
| 5,206,787 | 4/1993 | Fujioka | 257/307 |
| 5,223,729 | 6/1993 | Kudoh et al. | 257/296 |
| 5,326,714 | 7/1994 | Liu et al. | 437/52 |

OTHER PUBLICATIONS

"3–Dimensional Stacked Capacitor Cell for 16M and 64M DRAMS" by T. Ema et al. International Electron Devices Meeting, 1988, pp. 593–595.

Primary Examiner—Olik Chaudhuri
Assistant Examiner—H. Jey Tsai
Attorney, Agent, or Firm—George O. Saile

[57] ABSTRACT

A method for fabricating a capacitor having a fin-shaped electrode on a dynamic random access memory (DRAM) cell having increased capacitance was achieved. The capacitor is fabricated on a silicon substrate having an active device region. The device region contains a metal-oxide-semiconductor field effect transistor (MOSFET), having one capacitor aligned over and contacting the source/drain of the MOSFET in the device region. The capacitor is increased in capacitance by forming a multi-layer insulator structure over the storage capacitor area and recessing alternate layers, then using the form as a mold for forming a fin-like bottom capacitor electrode. A high dielectric constant insulator is deposited on the bottom electrode as the inter-electrode dielectric. The top capacitor electrode is formed by depositing a doped polysilicon layer which also fills the recesses having the bottom electrode forming therein fin-shaped top capacitor electrode and completing a dynamic random access memory (DRAM) cell. This method also eliminates the need to plasma etch to the source/drain contact during the fabrication of the capacitor, thereby improving reliability and making a more manufacturable process.

20 Claims, 5 Drawing Sheets

METHOD FOR MAKING FIN-SHAPED STACK CAPACITORS ON DRAM CHIPS

BACKGROUND OF THE INVENTION

1. Field of the Invention

This invention relates to a random access memory device and, more particularly, to a method of fabricating a three-dimensional stacked capacitors having increased capacitance.

2. Description of the Prior Art

The integrated circuit density on the semiconductor substrate and the semiconductor chips formed therefrom, has dramatically increased in recent years. This increase in density has resulted from down scaling of the individual devices built in and on the substrate and the increase in packing density. Future requirements for even greater increases in packing density, such as in ultra large semiconductor integration (ULSI), is putting additional demand on the semiconductor technologies and more particularly on the photolithographic techniques.

One circuit type experiencing this demand for increased density is the array of charge storage cells on a dynamic random access memory (DRAM) chip. These individual DRAM storage cells, consisting usually of a single metal-oxide-semiconductor field-effect transistor (MOSFET) and a single capacitor are used extensively in the electronics industry for storing data. A single DRAM storage cell stores a bit of data on the capacitor as electrical charge.

As the array of cells increase on the DRAM chip and capacitor decrease in size, it becomes increasingly more difficult to maintain sufficient charge on the storage capacitor to maintain an acceptable signal-to-noise level. These volatile storage cells also require more frequent refresh cycles in order to retain their charge.

since the storage capacitor must occupy an area limited by the cell size, in order to accommodate the array capacitors on the chip, it is necessary to explore alternative methods for increasing the capacitance without increasing the area that the capacitor occupies on the substrate surface.

Both a trench capacitor, formed in the substrate, and a stacked capacitor, formed on the surface and over the MOSFET, are being pursued for DRAM applications. The stacked capacitors has received considerable interest in recent years because of the variety of ways that its shape can be controlled to increase the capacitance without increasing the area it occupies on the substrate. This makes the stacked capacitor very desirable for DRAM application.

Numerous three-dimensional capacitor structures have been reported. For example, H-H. Tseng, U.S. Pat. No. 5,192,702 teaches methods of fabricating vertical sidewall capacitors and P. Fazan et al, U.S. Pat. No. 5,084,405 teaches methods of forming double ring stacked capacitors structures using sidewall spacer techniques.

However, one special type of three-dimensional stacked capacitor structure receiving considerable interest is the capacitor having a fin shaped electrode extending up-ward and over the cell area. The potential of stacking increased number of fin structures on the electrode and thereby further increasing the capacitance is of much interest. For example, an early publication by T. Ema et al entitled"3 -Dimensional Stacked Capacitor Cell for 16M and 64M DRAMS" , International Electron Devices Meeting, 1988 , pp 593–595 , IEEE, report on the use of multi-layers of polysilicon and insulators to form this capacitor structure. More recently, variation of this fin stacked capacitor structure have been proposed to improve earlier versions. See for example, P. Fazan et al U.S. Pat. No. 5,053,351, M. Taguchi U.S. Pat. No. 5,021,357 and C. Kudoh et al, U.S. Pat. No. 5,223,729. Most of these stacked fin capacitor structures require multiple deposition of conducting layers and insulating layers and additional etch steps. This additional processing in more than one processing system result in additional manufacturing cost and reduced reliability and yield.

Another approach by Y. Kohyana et al U.S. Pat. No. 5,142,639 teaches a method of using alternate layers of dissimilar insulating layers and then etches an opening in this multi-layer to the contact and selectively etching one of the insulating layers to form a fin-like template for forming thereon the bottom and top electrodes of the stacked capacitor.

Although there has been considerable work done to increase the capacitance area on these very small fin shaped stacked capacitors, it is still desirable to further improve these capacitors while retaining as simple a manufacturing process as possible. In many of these fin structured stacked capacitors a multilayer is formed and then the multilayer is etched open to the source/drain contact to form the node contact for the stacked capacitor. These contact openings are usually formed using anisotropic etching in a plasma etcher that require a D.C. (Direct Current) electrical bias on the substrate electrode upon which the substrates are placed within the etcher. The D.C. bias is required to achieve the directional etching of the sidewalls in the contact opening, but can also result in device degradation at the substrate surface. Therefore, it is highly desirable to have device processing that avoid this exposure to plasma etching, whenever possible.

SUMMARY OF THE INVENTION

Accordingly, it is a principal object of this invention to provide a stacked capacitor having fin-shaped electrodes with increased capacitance.

It is another object of the present invention to provide a method for fabricating these stacked capacitors using a multilayered insulator process in which the contact to the source/drain is not etched through the multilayered insulator, so as to avoid contact damage.

It is still another object of the invention to make the node contact of the bottom electrode of the capacitor to the source/drain contact of the MOSFET early in the fabrication process. This avoids having to later make a critical masking alignment for the contact opening and it also provide more latitude in the mask alignment and etching of the capacitor structure.

It is a further object of the invention to increase the capacitance while maintaining a simple manufacturing process with good reliability at low cost.

This invention addresses these objects by teaching a method for forming a multilayered stacked capacitor having the fin structure. A portion of the bottom electrode making contact to the source/drain of the DRAM and extending over the cell area is formed early in the process. This provides a means for making the stacked capacitor with only two masking levels and by avoiding the necessity to plasma etch to the source/drain contact.

A method is described for making a DRAM cell having this new stacked capacitor. First, an array of active device areas are formed surrounded and isolated from each other by a relatively thick field oxide. A charge passing transistor is formed in each active device region. The transistor is usually a metal-oxide-semiconductor field-effect-transistor (MOSFET) having source/drain contacts. The gate electrode of the transistor is formed over a thin gate oxide, in the active device area, by patterning a doped polysilicon layer using conventional photolithographic techniques and etching. The patterned polysilicon layer also serves as the word line conductors elsewhere on the DRAM chip. An insulating layer, usually composed of silicon oxide ($SiO_2$) and silicon nitride ($Si_3N_4$), is formed over the gate electrode and word line polysilicon pattern at the same time that the polysilicon is patterned. Sidewall spacers, also composed of an insulator, are then formed to facilitate the formation of lightly doped drains. The oxide over the polysilicon and the sidewall spacers also electrically insulate the device from further structures built thereon. The stacked capacitor is then formed making contact to one of the two source/drain contacts of the MOSFET and thereby forming the DRAM cell.

The bottom electrode of the stacked capacitor is formed by depositing a first polysilicon layer over the exposed source/drain contact opening and elsewhere on the substrate. Next, a multilayer is formed on the first polysilicon layer by depositing alternately two insulating layers having substantially differing etch rates. The number of insulating layers are variable and depend on the number of electrode fin structures required for the storage capacitor. The multilayered insulator is then patterned leaving portions with vertical sidewalls over the openings to the source/drain contacts. The insulator of one type is selectively and isotropically etched partially and laterally inward over the capacitor area forming alternating recesses in the sidewall of the multilayer. The bottom electrode is now formed by depositing a second polysilicon layer that conformably coats the recesses and the first polysilicon layer forming the bottom electrode having a fin-shaped structure. Photolithographic techniques and etching of the first and second polysilicon layers are used to define the individual bottom electrodes of the array of electrodes on the substrate. A thin high dielectric insulator is formed on the surface of the bottom electrode forming the inter-electrode insulator and then a third polysilicon layer is conformably deposited over the array of fin shaped bottom electrodes completing the array of storage capacitors.

The multilayered insulator can be formed sequentially in the same deposition system by alternating gas mixtures or in a multi-chamber system saving time and minimizing contamination. While utilizing the first polysilicon layer to form the node contact and the second polysilicon layer to complete the bottom electrode eliminates the need to plasma etch a contact opening in the thick multilayer insulator that can result in substrate damage and electrical degradation of the device.

BRIEF DESCRIPTION OF THE DRAWINGS

The objects and advantages of this invention are best understood by the following embodiments with reference to the attached drawings which are now briefly described.

DESCRIPTION OF THE PREFERRED EMBODIMENTS

Now in keeping with the objects of this invention, the method for forming the stacked capacitor with increased capacitance is covered in detail. The sequence of fabrication steps of this embodiment are shown in FIGS. 1 to 8. This storage capacitor can be fabricated on a N-channel MOSFET structures which are currently used in the manufacture of DRAMs. Therefore, only a brief description of the MOSFET structure is given, sufficient for understanding the current invention.

It should also be well understood by one skilled in the art that by including additional process steps, in addition to those described in this embodiment, other types of devices can also be included on the DRAM chip, For example, P channel MOSFETs can be formed by providing N-Wells in the P substrate and Complementary Metal-Oxide-Semiconductor (CMOS) circuits can also be formed therefrom.

Figure 1:
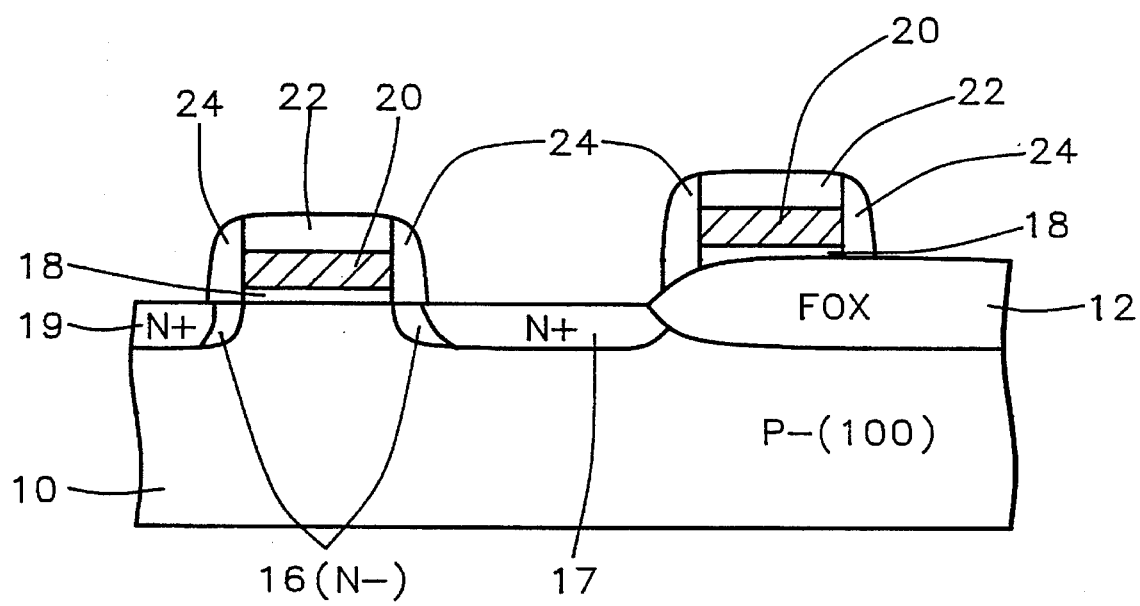
FIGS. 1 through 8 are schematical cross-sectional representations of the embodiment for the method of fabricating the fin-type stacked capacitor of this invention used with a MOSFET to make a DRAM storage cell.

Referring now to FIG. 1, a cross-sectional view of the substrate 10 having a partially completed DRAM cell formed on and in the substrate surface, is schematically shown. The preferred substrate is composed of a P-type single crystalline silicon having a <100> crystallographic orientation. A relatively thick Field OXide (FOX) 12 is formed around the active device regions to isolate these individual device regions. This field oxide, only partially shown in FIG. 1, is formed by depositing a thin silicon oxide (pad oxide) and a thicker silicon nitride layer as an oxidation barrier layer. Conventional photolithographic techniques and etching are then used to remove the barrier layer in areas where a field oxide is desired while retaining the silicon nitride in areas where active devices are to be fabricated. The silicon substrate is then oxidized to form the field oxide. The preferred thickness is between about 4500 to 5500 Angstroms.

The semiconductor device is then formed in the active device regions after removing the silicon nitride barrier layer and pad oxide in a wet etch. The most commonly used device for dynamic random access memory is the metal-oxide-semiconductor field-effect transistor (MOSFET). This device is formed by first thermally oxidizing the active device region to form a thin gate oxide 18. The preferred thickness being from about 90 to 200 Angstroms. An appropriately doped polysilicon layer 20 and an insulating layer 22 are deposited and conventional photolithographic techniques and etching are used to pattern the insulating layer 22 and polysilicon layer 20. This forms the gate electrode 20 for the MOSFET in the active device regions and conducting patterns elsewhere on the substrate with the insulating layer 22 thereon. These conducting patterns form the word lines that electrically connect the MOSFET gate electrode to the appropriate peripheral circuits on the DRAM chip. The lightly doped source/drain 16 are formed next, usually by implanting a N-type dopant species such as arsenic or phosphorus. For example, a typical implant might consist of phosphorus $p^{31}$ at a dose of between 1 E 13 to 10 E 13 atoms/$cm^2$ and an energy of between about 30 to 80 Kev.

After forming the lightly doped source/drain, sidewall spacers 24 are formed on the gate electrode 20 sidewalls. These sidewall spacers are formed by depositing a low temperature silicon oxide and anisotropically etching back to the silicon surface. For example, the silicon oxide could be a chemical vapor deposition using tetraethoxysilane (TEOS) at a temperature in the range of about 650° to 900° C. and the etch back performed in a low pressure reactive ion etcher. The N +source/drain implantation is used to complete the source/drain regions 17. For example, arsenic ($As^{75}$) can be implanted at a dose of between 2 E 15 to 1 E 16 atoms/cm$^2$ and energy of between about 20 to 70 Kev. Alternatively, the source/drain contacts can be completed at a later process step whereby the dopant is out diffused from a doped polysilicon layer.

The remainder of this embodiment relates more specifically to the objects of this invention, which addresses now in detail the method of forming a fin-shaped bottom electrode for increasing the electrode area. The invention utilizes a patterned multilayer of alternating dissimilar insulating layers and an isotropic etching to form a series of recesses in the sidewall of the multilayer for forming the fin-type bottom electrode.

Figure 2:
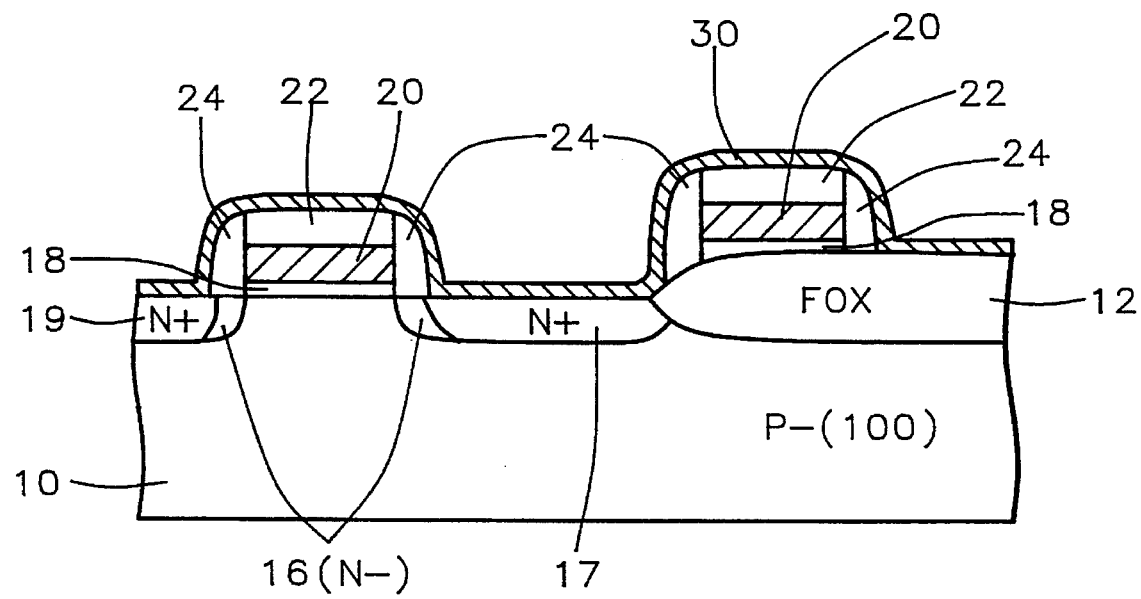

Referring now to FIG. 2, A first polysilicon layer 30 is deposited over the MOSFET formed in the active device area and over the word lines elsewhere on the substrate and making electrical contact to the source/drain area of the MOSFET. The insulating layer 22 and the sidewall spacers 24 providing electrical isolation of the gate electrode 20 and word lines from polysilicon layer 30. The preferred thickness of the first polysilicon layer 30 is between about 200 to 1000 Angstroms and the deposition process of choice is a low pressure chemical vapor deposition (LPCVD). The polysilicon layer 30 is then doped N-type by implantation using arsenic ions ($As_{57}$). The preferred implantation dose is from between about 1 E 14 to 1 E 16 atoms/cm$^2$ and at implantation energy between about 40 to 100 Kev. More specifically, the thickness of layer 30 is 500 Angstroms and the implantation dose is 5 E 15 atoms/cm2 having an implantation energy of 50 Kev.

This first polysilicon layer 30 forms a portion of the bottom electrode of the stacked capacitor that makes the capacitor node contact to the source/drain area 17 of the MOSFET.

Figure 3:
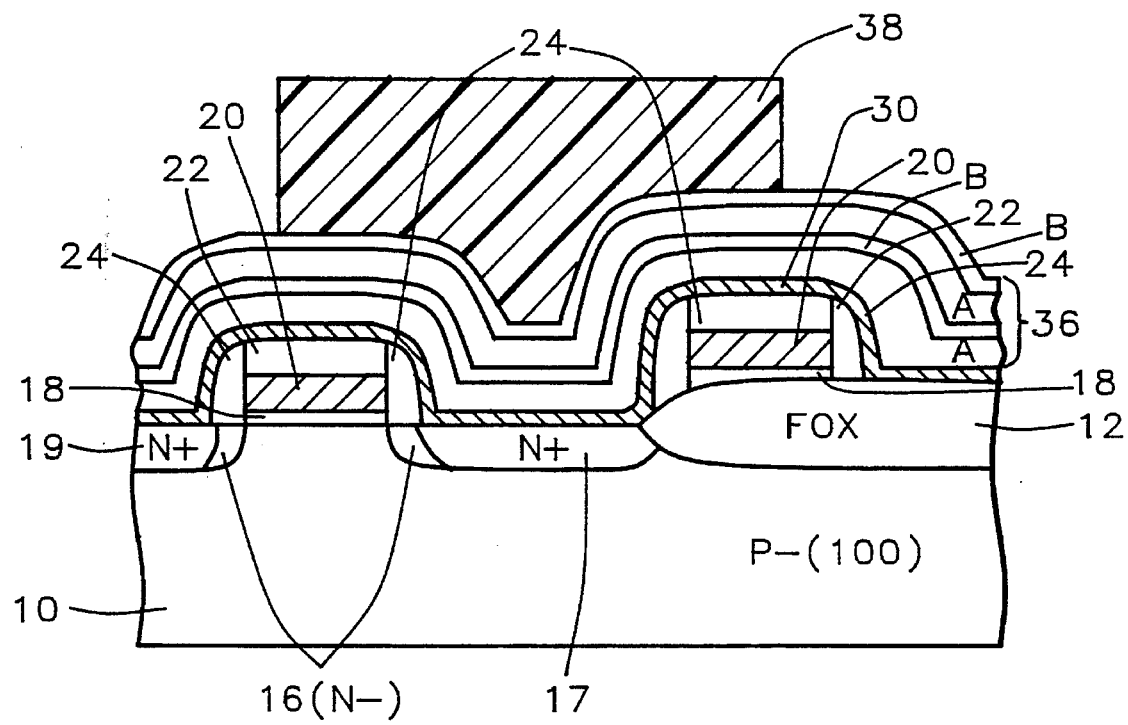

Referring now to FIG. 3, a multilayered structure 36 is deposited over the first polysilicon layer 30 and consisting of alternate layers of dissimilar insulator types, as labeled A and B in FIG. 3. The two insulator types having substantially different etch rates in a given solution or vapor phase etchant. The preferred materials are silicon oxide for layers labeled A and silicon nitride for layers labeled B. Alternatively, other dissimilar insulator types having large etch rate differences can also be used. For example, phosphosilicate glass (PSG) can be used as an alternative for silicon oxide and silicon oxynitride as an alternative for silicon nitride. The preferred method for depositing the silicon oxide and silicon nitride is an in situ multi-step deposition process where the alternate layers are deposited sequentially by changing the deposition gas mixture in the process chamber. For example, an Applied Materials Corp. model P5000 deposition system utilizing a plasma enhanced chemical vapor deposition (PECVD) process can be used with a gas mixture of silane ($SiH_4$) and nitrous oxide ($N_2O$) for depositing the silicon oxide and a gas mixture of silane ($SiH_4$) and ammonia ($NH_3$) for depositing the silicon nitride. The preferred thickness of the silicon oxide layer labeled A is in the range of about 1000 to 2000 Angstroms and more specifically having a thickness of 1500 Angstroms and the preferred thickness of the silicon nitride layer labeled B is between about 300 to 1000 Angstroms and more specifically having a value of 500 Angstroms. For demonstration purposes only four layers are shown in FIG. 3, but it should be well understood by one skilled in the art that additional layers can be used without departing from the spirit and scope of the invention.

Figure 4:
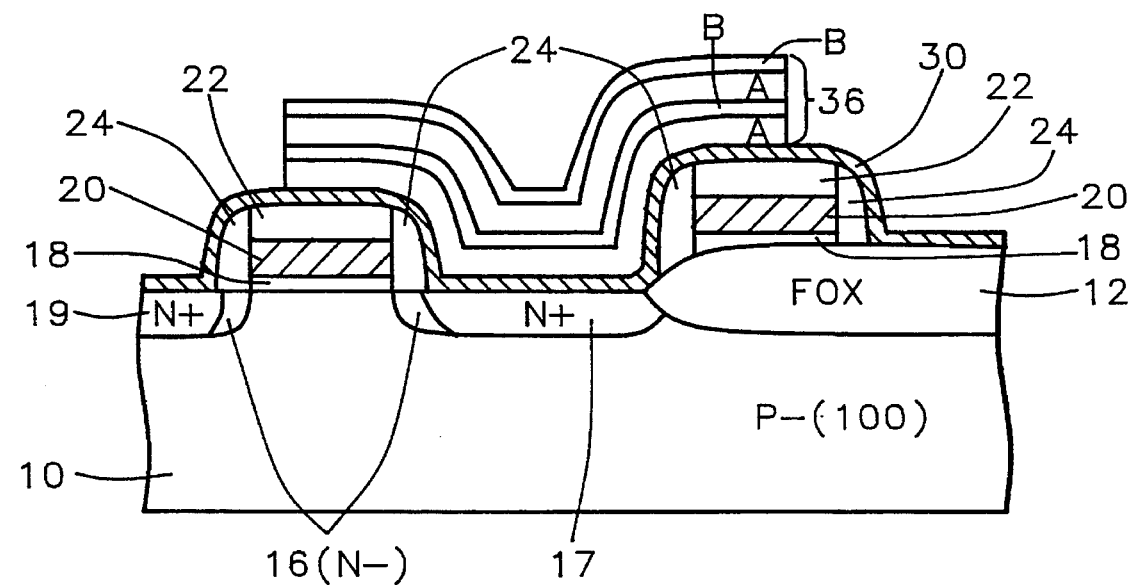

Referring still to FIG. 3, a conventional photolithography is used to form a patterned photoresist mask 38 over the multilayered structure 36 and aligned to the source/drain area 17 and having the top surface of the multilayer 36 exposed elsewhere on the substrate. The multi-layer 36 is then anisotropically etched to the surface of the first polysilicon layer 30 and the photoresist is removed by conventional means. As shown in FIG. 4. The anisotropic etch is preferably performed in a low pressure plasma etcher. One suitable etcher is an AME-8310 etcher manufactured by Applied Materials Corp. This etch results in an array of structures composed of multilayer 36 over the capacitor node contacts and DRAM cell areas having vertical sidewalls. Only one of an array of cell areas is depicted in FIG. 4, for practical reasons.

Figure 5:
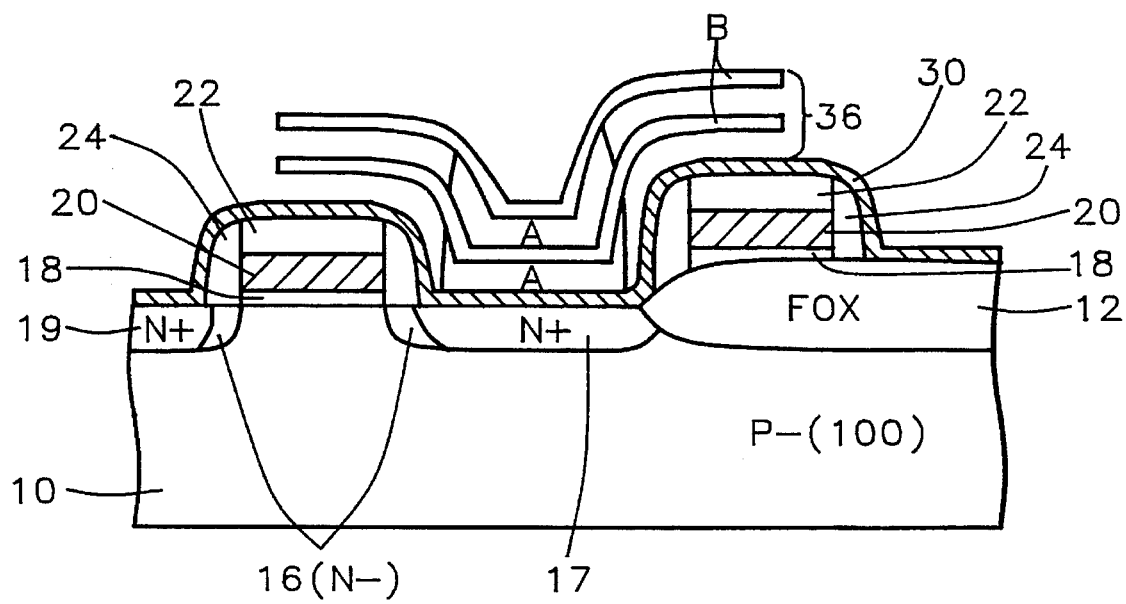

Referring now to FIG. 5, an isotropic etch is used to etch and thereby recess the alternate silicon oxide layers A making up the multi-layer 30 while leaving unetched the silicon nitride layer B. This forms a fin shaped profile in the sidewall of the multi-layer 36. The preferred etchant is a buffered hydrofluoric acid solution (BHF) which etches silicon oxide while leaving essentially unetched the silicon nitride. Alternatively, a plasma etch (dry etch) can also be used. For example, the isotropic etch can be performed in a plasma mode etcher using a gas mixture of carbon tetrafluoride ($CF_4$) and hydrogen ($H_2$) and having an etch rate selectivity of about 20. This fin shaped surface is now used to form the bottom electrode of the stacked capacitor.

Figure 6:
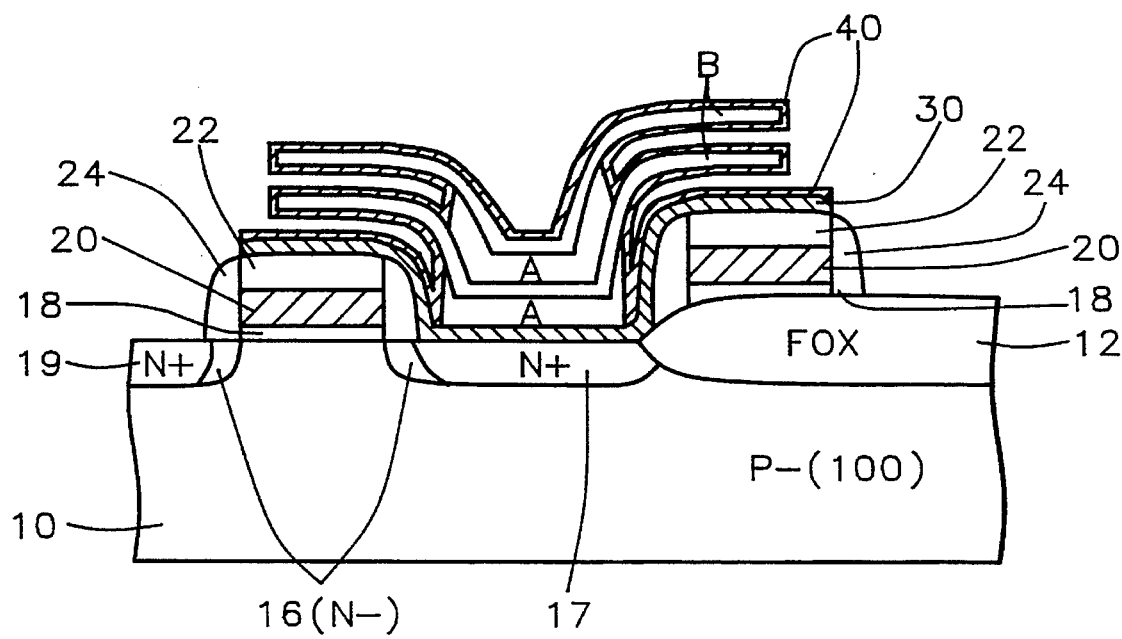

Now, as shown in FIG. 6, a second polysilicon Layer 40 is deposited over the multi-layer 36, forming a conformal polysilicon layer on and within the recesses of multilayer 36 and on the first polysilicon layer 30 that makes electrical contacting to the source/drain area 17. The preferred polysilicon layer is deposited using a low pressure chemical vapor deposition (LPCVD) process and the polysilicon layer is also in-situ doped using a N-type impurity such a phosphorus. For example, the doping can be achieved by adding the phosphorous halide $POCl_3$ or phosphine ($PH_3$) to the LPCVD reactant gas. The preferred thickness of layer 40 is between about 200 to 400 Angstroms and more specifically having a thickness of 300 Angstroms and the preferred dopant concentration being between about 1 E 19 to 1 E21 atoms/cm$^3$.

Conventional photolithographic techniques and reactive plasma etching are then used to patterned the first polysilicon layer 30 and the second polysilicon layer 40 leaving portion over the multilayer 36 and thereby forming the bottom electrode capacitor structure having a fin-like shape, as is also shown in FIG. 6. The complete removal of polysilicon layers 30 and 40, by the etching, elsewhere on the substrate also electrically isolates each bottom electrode from the adjacent electrodes of the array of electrodes that are form simultaneously on the substrate. Only one bottom electrode structure is shown in FIG. 6.

Figure 7:
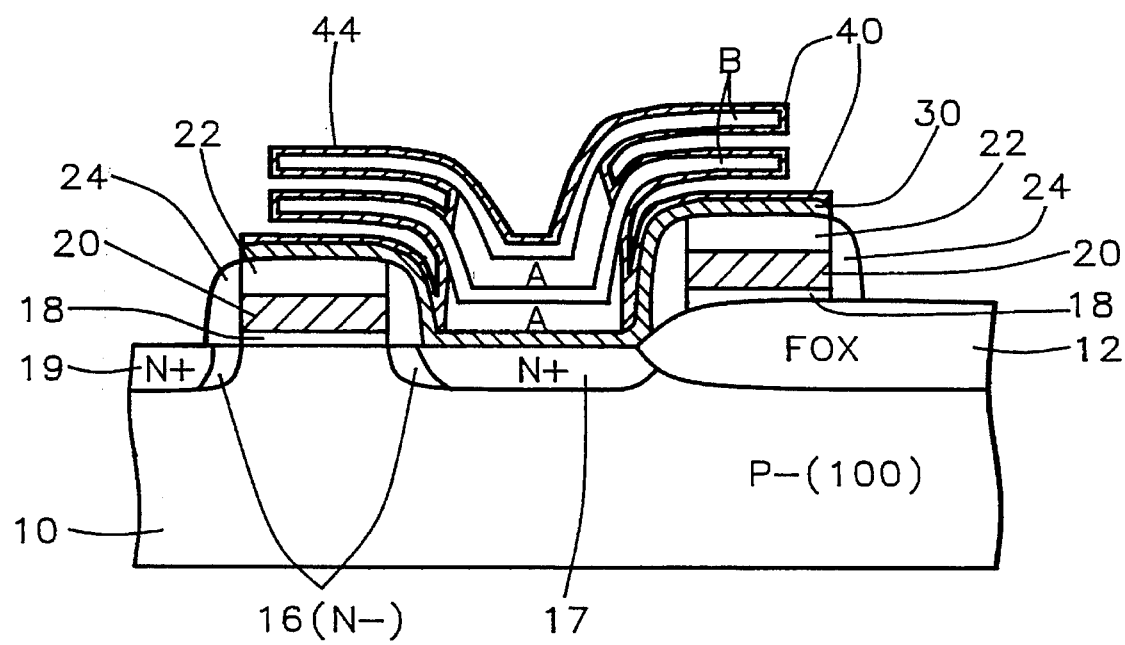

Referring next to FIG. 7, the capacitor interelectrode dielectric layer 44 is formed on the remaining polysilicon layer 40 that forms the capacitor bottom electrode. Preferably, the dielectric layer 44 is composed of layers of silicon nitride and silicon oxide ($Si_3N_4/SiO_2$) or layers of silicon oxide, silicon nitride and silicon oxide (ONO). For example, the dielectric layer 44 composed of silicon nitride and silicon oxide can be formed by depositing a silicon nitride layer using LPCVD and a reactive gas mixture of ammonia ($NH_3$) and dichlorosilane ($SiH_2Cl_2$) followed by oxidation of the silicon nitride layer in wet oxygen at a temperature of about 850° C. for about 10 minutes. The preferred total thickness of the interelectrode dielectric is between about 30 to 150 Angstroms.

Figure 8:
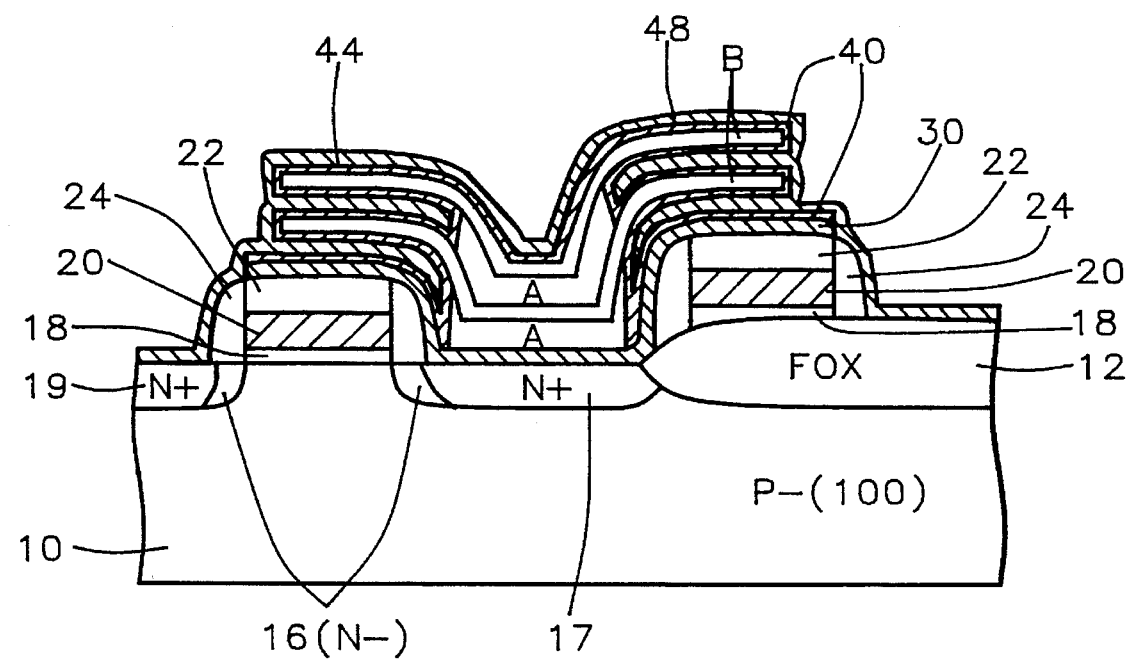

Now as shown in FIG. 8, a third polysilicon layer 48 is deposited on the interelectrode dielectric layer 44, forming the top electrode of the storage capacitor and completing the fin shaped storage capacitors. The preferred thickness of polysilicon 48 is from between about 500 to 2000 Angstroms and is doped with a N-type impurity, for example, by using a phosphorus species. The preferred concentration being in the range of between about 1 E 19 to 5 E 20 atoms/cm$^3$. For example, low pressure chemical vapor deposition (LPCVD) and in-situ doping is used to deposit the conformal polysilicon layer 48.

It should be well understood by one skilled in the art that by including additional process steps the bit line contact and the bit line metallurgy can be formed either prior to or after the stacked storage capacitor is fabricated as is commonly reported in the literature and practice in the industry.

In the particular embodiment, of this invention, the formation of the bit line contact and the bit line over the fin-shaped storage capacitor is described. The additional details shown in FIG. 9 and described here are in sufficient detail to complete the fabrication of a dynamic random access memory (DRAM) cell for use in a DRAM circuit.

Figure 9:
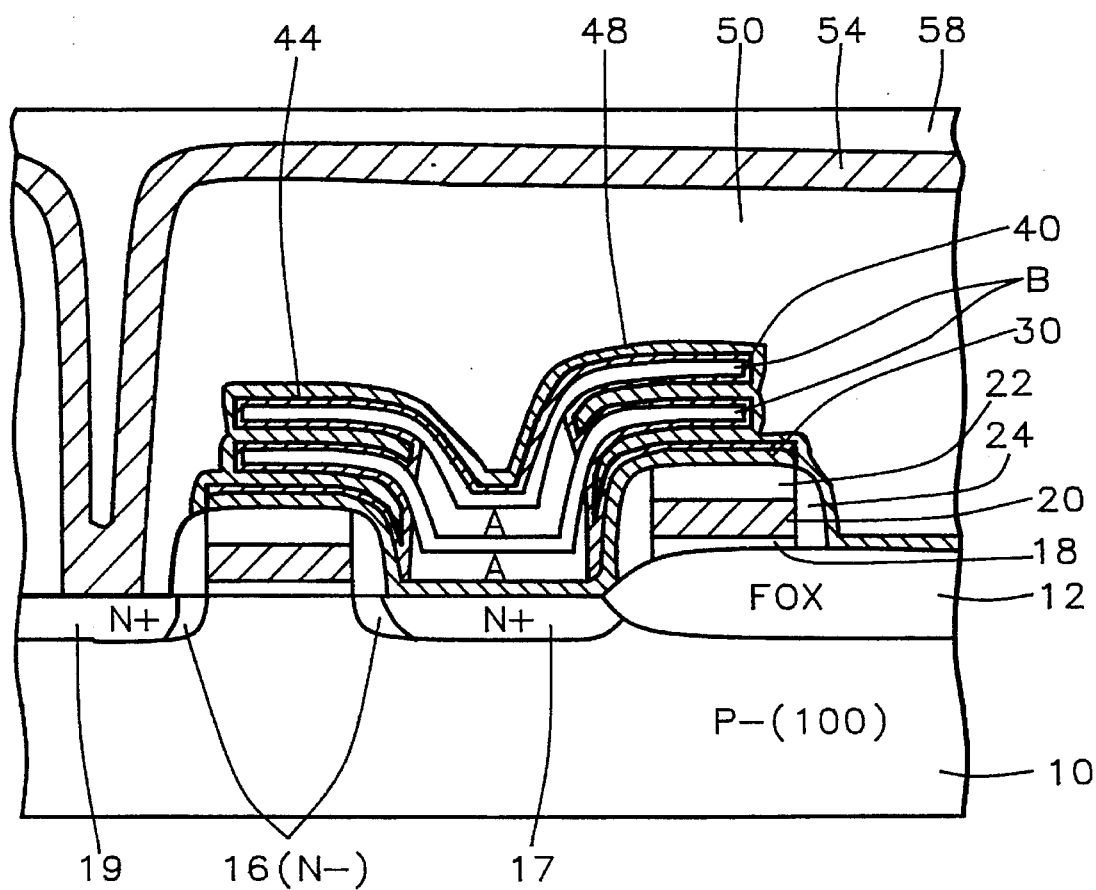
FIG. 9 is a schematical cross section of a completed DRAM storage cell with bit line contacts and bit line metallurgy formed thereon.

As shown in FIG. 9, a contact opening is formed to the second of the two source/drain contacts area 19 by photoresist masking and etching the third polysilicon layer 48 and the dielectric layer 44. A first insulating layer 50 composed of a low flow temperature glass is then deposited and annealed to planarize the surface. The material of choice is a phosphoborosilicate glass (PBSG) and the preferred thickness is between about 3000 to 8000 Angstroms. A bit line contact mask and an appropriate photolithographic technique are used to open the bit line contact in PBSG layer 50 over and to the second source/drain contact area 19. A fourth polysilicon layer 54 is deposited and doped N-type, for example, by implanting with arsenic or phosphorus ions. The substrate is then annealed to drive-in the impurity from layer 50 to form the appropriate ohmic contact at the bit line contact area over the source/drain 19. Next, a metal silicide layer, not explicitly shown in FIG. 9, is formed on the bit line polysilicon layer 54 to increase its conductivity. The preferred method is the deposition of a metal layer followed by a low temperature anneal. The preferred silicide being tungsten silicide (WSi). Then the WSi bit line wiring is patterned using photolithographic techniques and reactive plasma etching and then a second insulating layer 58 is, for example composed of BPSG, is deposited and annealed at elevated temperatures to planarize the surface and complete the dynamic random access memory (DRAM) cell.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a stacked storage capacitor on a semiconductor substrate having device areas with field effect transistor source/drain areas and word lines formed therein comprising the steps of:

depositing a first polysilicon layer on said substrate and making electrical contact to source/drain area of said device area;

depositing on said first polysilicon layer a multi-layer of two insulator having alternate layers composed of a first insulator and the other layers composed of a second insulator, said insulator having a top surface;

patterning said multilayer over said first polysilicon layer and over and aligned to said source/drain and having vertical sidewalls;

selectively and isotropically etching said first insulator and leaving said second insulator unetched in said sidewall of said multilayer and forming a multiple of fin-shaped recesses in said sidewall;

depositing a second polysilicon layer over and in said multi-layer fin-shaped recesses of said sidewall and forming a fin-shaped polysilicon structure that makes electrical contact to said first polysilicon layer and thereby to said source/drain areas of said device area;

patterning said second and first polysilicon layers leaving portions of said second polysilicon layer over said multilayer and on said top surface of said second insulator and leaving portions of said first polysilicon layer under said multilayer and removing completely said second and first polysilicon layers elsewhere on said substrate thereby forming a bottom capacitor electrode; depositing a capacitor dielectric layer over said bottom capacitor electrode and forming an interelectrode insulating layer; depositing a third polysilicon layer over said dielectric layer forming the top capacitor electrode and completing said stacked storage capacitor having a fin-shaped structure.

2. The method of claim 1, wherein said first polysilicon layer is doped with N-type impurities and having a thickness of between about 200 to 1000 Angstroms.

3. The method of claim 1, wherein said multilayer is composed of at least two layers.

4. The method of claim 1, wherein said first insulator and second insulator have different etch rates in the same etchant.

5. The method of claim 4, wherein said first insulator is silicon oxide having a thickness of between about 1000 to 2000 Angstroms and said second insulator is silicon nitride having a thickness between about 300 to 1000 Angstroms.

6. The method of claim 1, wherein said first insulator is deposited first on said first polysilicon layer.

7. The method of claim 1, wherein said second polysilicon layer is doped with N-type impurities and has a thickness of between about 200 to 400 Angstroms.

8. The method of claim 1, wherein said capacitor dielectric is silicon oxide and silicon nitride (ON) having a total thickness of between about 30 to 150 Angstroms.

9. The method of claim 1, wherein said third polysilicon layer is doped with N-type impurities and has a thickness of between about 500 to 2000 Angstroms.

10. The method of claim 1, wherein said bottom capacitor electrode of said storage capacitor makes electrical contact to the source/drain of a field effect transistor in said device area and together comprise a dynamic random access memory cell.

11. A method for fabricating a dynamic random access memory (DRAM) cell with a field-effect-transistor (FET) having device source/drains and a storage capacitor formed on and in a semiconductor substrate therein comprising the steps of forming said storage capacitor by:

depositing a first polysilicon layer on said substrate and making contact to said source/drain of said field effect transistor;

depositing on said first polysilicon layer a multilayer of two insulators having alternate layers composed of one insulator, and the other layers composed of a second insulator said second insulator having a top surface;

patterning said multilayer over said first polysilicon layer and over and aligned to said source/drain and having vertical sidewalls;

selectively etching one insulator and leaving said second insulator unetched in said sidewall of said multilayer and forming a multiple of fin-shaped recesses in said sidewall;

depositing a second polysilicon layer over and in said multi-layer fin-shaped recesses of said sidewall and forming a fin-shaped polysilicon structure and making electrical contact to said first polysilicon layer and thereby making electrical contact to said source/drain areas of said fields effect transistor;

patterning said second and first polysilicon layers leaving portions of said second polysilicon layer over said multilayer and on said top surface of said second insulator and leaving portions of said first polysilicon layer under said multilayer and removing completely said second and first polysilicon layers elsewhere on said substrate thereby forming a bottom capacitor electrode of said storage capacitor;

depositing a capacitor dielectric layer over said bottom capacitor electrode and forming an inter-electrode insulating layer;

depositing a third polysilicon layer over said capacitor dielectric layer forming a top capacitor electrode and completing said storage capacitor;

said storage capacitor contacting said source/drain of said field effect transistor and completing said dynamic random access memory cell.

12. The method of claim 11, wherein said first polysilicon layer is doped with N-type impurities and having a thickness of between about 200 to 1000 Angstroms.

13. The method of claim 11, wherein said multilayer is composed of at least two layers.

14. The method of claim 11, wherein the said first insulator and said second insulator having different etch rates in the same etchant.

15. The method of claim 14, wherein said first insulator is silicon oxide having a thickness of between about 1000 to 2000 Angstroms and said second insulator is silicon nitride having a thickness between about 300 to 1000 Angstroms.

16. The method of claim 1, wherein said first insulator is deposited first over said first polysilicon layer.

17. The method of claim 11, wherein said second polysilicon layer is doped with N-type impurities and has a thickness of between about 200 to 400 Angstroms.

18. The method of claim 11, wherein said capacitor dielectric is silicon oxide and silicon nitride (ON) having a total thickness of between about 30 to 150 Angstroms.

19. The method of claim 11, wherein said third polysilicon layer is doped with N-type impurities and has a thickness of between about 500 to 2000 Angstroms.

20. The method of claim 11, wherein said bottom capacitor electrode of said storage capacitor makes electrical contact to the source/drain of a field effect transistor in said device area and together comprise a dynamic random access memory cell.

* * * * *